United States Patent [19]

Lackey, Jr.

[11] Patent Number: 5,691,997
[45] Date of Patent: Nov. 25, 1997

[54] ENCODER FOR USE IN ASYNCHRONOUS TRANSFER MODE SYSTEMS

[75] Inventor: Stanley A. Lackey, Jr., Groton, Mass.

[73] Assignee: Cisco Systems, Inc., San Jose, Calif.

[21] Appl. No.: 535,453

[22] Filed: Sep. 28, 1995

[51] Int. Cl.$^6$ .................................................... G06F 11/10
[52] U.S. Cl. ........................................ 371/53; 370/473
[58] Field of Search ................... 371/37.1, 53; 370/395, 370/473

[56] References Cited

U.S. PATENT DOCUMENTS

| | | | |
|---|---|---|---|
| 5,121,397 | 6/1992 | Norrod | 371/54 |
| 5,247,524 | 9/1993 | Callon | 371/53 |
| 5,528,588 | 6/1996 | Bennett et al. | 370/396 |
| 5,541,918 | 7/1996 | Ganmukhi et al. | 370/395 |

*Primary Examiner*—Stephen M. Baker
*Attorney, Agent, or Firm*—Cesari and McKennna, LLP

[57] ABSTRACT

A destination station receives from a network a data packet that is transmitted as a plurality of cells and separately encodes each of the received cells, to produce associated, individual c-bit partial CRC remainders, where c is the number of bits in the CRC remainder associated with the packet. These partial CRC remainders correspond to the respective contributions that the cells make to the packet CRC pattern. The encoder appends the partial CRC remainders to the cells, and the station then stores them in an associated memory and links the individual cells to previously stored cells from the same packet with pointers. Once all the cells of a packet are encoded and stored, the destination station retrieves appended partial CRC remainders from the memory, and provides the remainders to a partial CRC encoder. The encoder manipulates the partial remainders and produces a packet CRC remainder. If the CRC packet is error-free, this packet CRC remainder matches the predetermined CRC pattern associated with the CRC code.

11 Claims, 4 Drawing Sheets

ENCODER FOR USE IN ASYNCHRONOUS TRANSFER MODE SYSTEMS

FIELD OF THE INVENTION

This invention relates generally to communications systems and, more particularly, to asynchronous transfer mode systems.

BACKGROUND OF THE INVENTION

In asynchronous transfer mode (ATM) systems a source station separates a multiple byte data packet into a plurality of fixed-length cells.

Each cell contains a 5-byte header that includes routing and other information, and a payload of up to 48 data bytes. Padding is appended, as necessary, to ensure that the payload of each cell is 48 bytes in length. These cells, in turn, are assembled into multiple-cell frames, which are transmitted over a network to a designated destination station.

The destination station accumulates the cells, or more specifically data bytes included therein, and reassembles them into the respective data packets. Before sending a data packet to an end user, the destination station performs an error detection operation, to determine if the packet is error free. If the packet contains errors, the destination station typically refrains from sending the packet to the end user.

An ATM adaptation layer (AAL) is responsible for segmenting the data packets into the cells at the source station and reassembling the cells into the packet at the destination station. One version of AAL, referred to as AAL 5, includes in the last cell of a data packet a multiple-bit CRC remainder, which is produced at the source station by encoding the packet data bytes in accordance with a CRC code. Using the AAL 5 protocol, the destination station determines if the packet contains errors by encoding the received data bytes and the CRC remainder, in accordance with the CRC code, and comparing the result to a predetermined constant, or CRC pattern. If the two match, the destination station determines that the packet is error-free. Conversely, if the two do not match, the station determines that the packet contains errors.

Each data packet is encoded at the source station by (i) selectively combining the first data byte of the packet with the contents of a register that has been set to an initial condition, (ii) using the result of the encoding to update the register, (iii) encoding a next byte by selectively combining it with the contents of the updated register, (iv) updating the register with the results of the encoding, and so forth, until all of the data bytes in the packet have been encoded. After the last data byte is encoded, the 1s complement of the contents of the register are appended to the packet as the CRC remainder, the packet is segmented into the fixed-sized cells, and the cells typically are packed into frames for transmission to the designated destination station.

Generally, the cells are transmitted as part of a stream of traffic over the network, such that the cells associated with an individual data packet are spread out, with cells from other data packets in between them. In one implementation, the cells are packed into frames, with the cells from other packets packed in between them. This means that the destination station typically receives, in any one transmission, portions of multiple data packets. In the time it takes the station to receive a complete data packet, it may receive portions of thousands of packets. Accordingly, the destination station must coordinate and control the error detecting operations for all of these data packets.

In known prior systems, the destination stations use one of two methods to control the error detecting operations. Using a first method, the destination station stores the received cells in an associated memory, with the cells associated with a particular packet "linked" to each other. When the last cell of a packet is received, the station retrieves the cells from the memory, reassembles the packet and encodes the data and the included CRC remainder to reproduce the CRC pattern. The station then compares the reproduced pattern to the actual pattern and determines if the packet is error free.

These retrieval and encoding operations take a relatively long time, particularly if the data packets are large. Accordingly, there can be an unacceptably long delay between the time the complete packet is received by the destination station and the time that the packet is forwarded from that station to an end user. Also, the associated memory must include extra storage locations, to hold various complete data packets until they can be checked for errors by the station.

Using the alternative method, the destination station encodes the cells as the cells are received. To do this the CRC encoder must maintain thousands of running CRC accumulations, one for each partially-received packet, because there is not enough time as the cells are received for the encoder to (i) retrieve the appropriate CRC accumulation from an associated memory, (ii) use the retrieved accumulation to update the encoder's register, and (iii) encode the cell. The encoder must thus include buffers with sufficient space, associated addressing circuitry and so forth, to manipulate the thousands of CRC accumulations. This increases the complexity of the encoders.

SUMMARY OF THE INVENTION

The invention is an encoder that, as cells are received, separately encodes them, to produce associated, individual multiple-bit partial CRC remainders. These remainders correspond to the respective contributions that the cells make to the packet CRC pattern. The encoder appends the partial CRC remainders to the cells, and the station then stores them in an associated memory and links them to previously stored cells from the same packet. Once all the cells of a packet are encoded and stored, the destination station retrieves the partial CRC remainders from the memory, and provides them to a partial CRC encoder. The encoder manipulates the partial remainders and produces a packet CRC pattern. If the CRC packet is error-free, its data pattern matches the predetermined CRC pattern associated with the CRC code.

More specifically, the CRC encoder in the destination station encodes a received cell in accordance with the CRC code, and appends the result to the cell as the partial CRC remainder. As discussed above, the cell, with its appended partial CRC remainder, is stored in the associated memory and linked to any previously received cells that are associated with the same data packet. The encoder thereafter encodes the succeeding cells, as they are received, and appends the results to the cells as the partial CRC remainders. Each of these cells is stored in the memory, linked to the previously recorded cells of the same packet.

When all the cells of one of the packets have been encoded and stored, the station verifies the packet by retrieving the partial remainders from the memory. The encoder then, as discussed above, manipulates the retrieved remainders, and reproduces the packet CRC pattern. The manipulation operations are discussed in more detail below. If the CRC verifies that the packet is error-free, the entire packet is then retrieved from memory and forwarded to an end user.

The encoder can quickly encode the partial CRC remainders to determine if the associated packet is error-free, since this encoding requires manipulation of only the relatively small number of bits in the partial remainders. It can thus perform the encoding in the short period of time between the receipt of successive transmission bursts, and the station can essentially transmit the packet to the end user as soon as it is received. This is in contrast to known prior systems that, after the packet is received, retrieve and encode the entire packet, that is, encode all of the data bytes in all of the cells in one encoding operation. This not only delays the forwarding of the packet to the end user, it also consumes memory resources since the entire packet must be read back before the CRC can be used to verify that the packet is error-free.

In contrast to the known prior encoders that maintain running CRC accumulations of encoded cells, and thus, must include sufficient on-chip buffer space, the partial-remainder encoder stores the encoded cells and the partial CRC remainders in an associated memory. This reduces the complexity of the encoder, by eliminating from it both the buffer space and the associated buffer control circuitry.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Section 1 discusses the encoding operations of a source station operating in accordance with AAL5. Section 2 discusses, in terms of a specific example in AAL5, the CRC verification operation of a destination station that is constructed in accordance with the current invention. Section 3 discusses in general terms the CRC verification operations of the destination station.

1. Source Station Encoding

Figure 1:
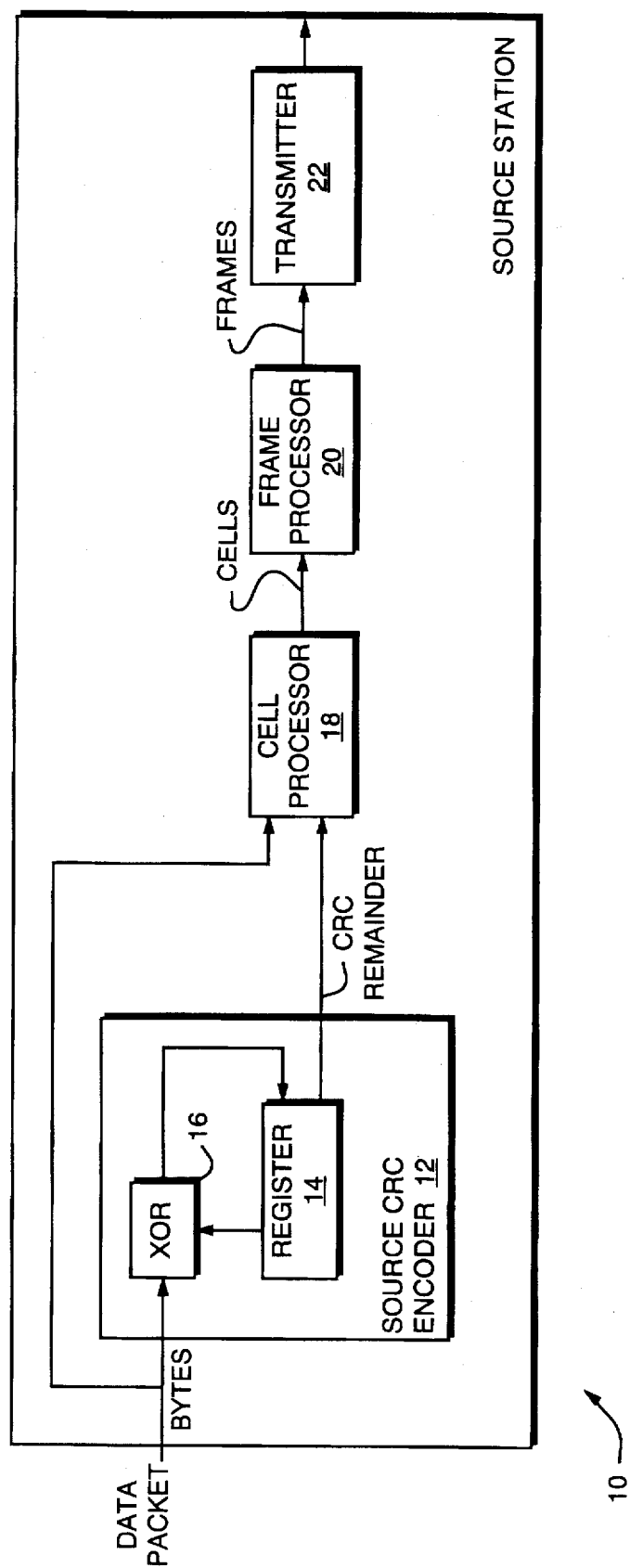
FIG. 1 is a functional block diagram of a source station.

Referring to FIG. 1, a source station 10 receiving data from, for example, a peripheral device (not shown), supplies a data packet to a CRC encoder 12. The CRC encoder 12, operating in a conventional manner, initializes, or sets, a "c"-bit checksum register 14 to a "seed" value, where c, which is the number of bits in the CRC remainder, equals 32 for AAL5. The encoder 12 then combines, that is, XOR's, the first data byte of the packet with the contents of a register 14, using XOR gates 16. The result of the encoding of the first data byte is then used to update the register 14. The first data byte is also provided to a cell processor 18.

The encoder 12 encodes the second data byte of the data packet in the same manner, by combining it with the contents of the updated register 14, and again updating the register 14 with the result. This data byte is similarly provided to the cell processor 18. The encoder repeats these encoding and updating operations with the next data byte, and so forth, until all the data bytes in the packet have been encoded. The contents of the register 14, are then supplied to the cell processor 18, as the packet CRC remainder, or checksum.

Figure 2:
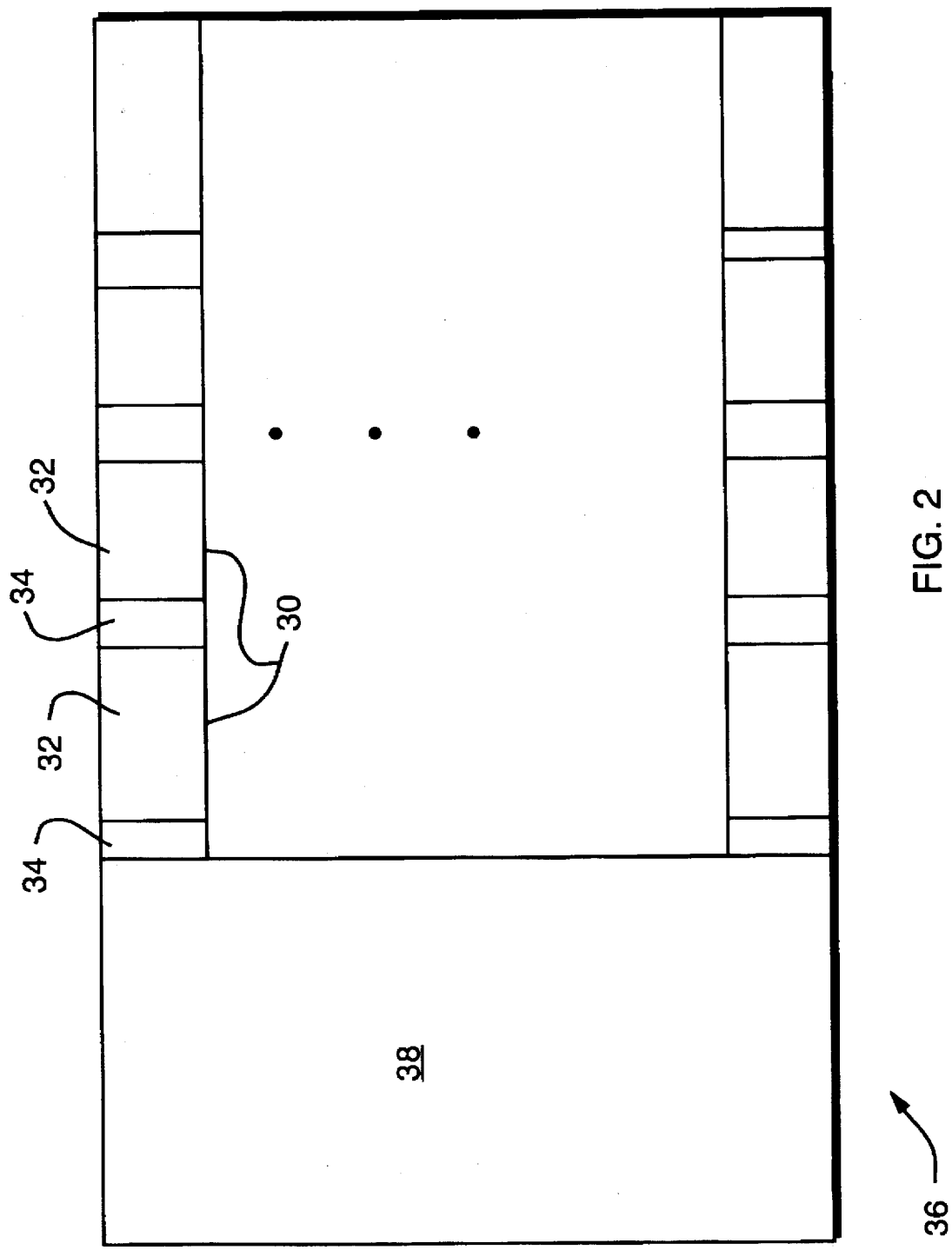
FIG. 2 is an illustration of a cell and a frame.

Referring also to FIG. 2, the cell processor 18 segments the data into cells 30. It first separates the data into groups of "n" bytes and appends to each group an appropriate b-byte header 34 that contains routing and other information, where in AAL5 n=48 and b=5. The processor 18 includes the 32-bit CRC remainder as the last 4 bytes of the last cell. As necessary, padding is included in one or more of the cells, to ensure that each cell has a payload 32 of 48 bytes.

The cell processor 18 supplies the cells to a frame processor 20. The frame processor 20 separates these cells and, as appropriate, the cells of other packets into groups of "f" cells. It appends header and control information 38 to the groups to form for each group a frame 36. The source station 10 then transmits the frames 36 over a network (not shown) to a designated destination station 40 (FIG. 3).

2. Destination Station Encoding Using Partial CRC Remainders

Figure 3:
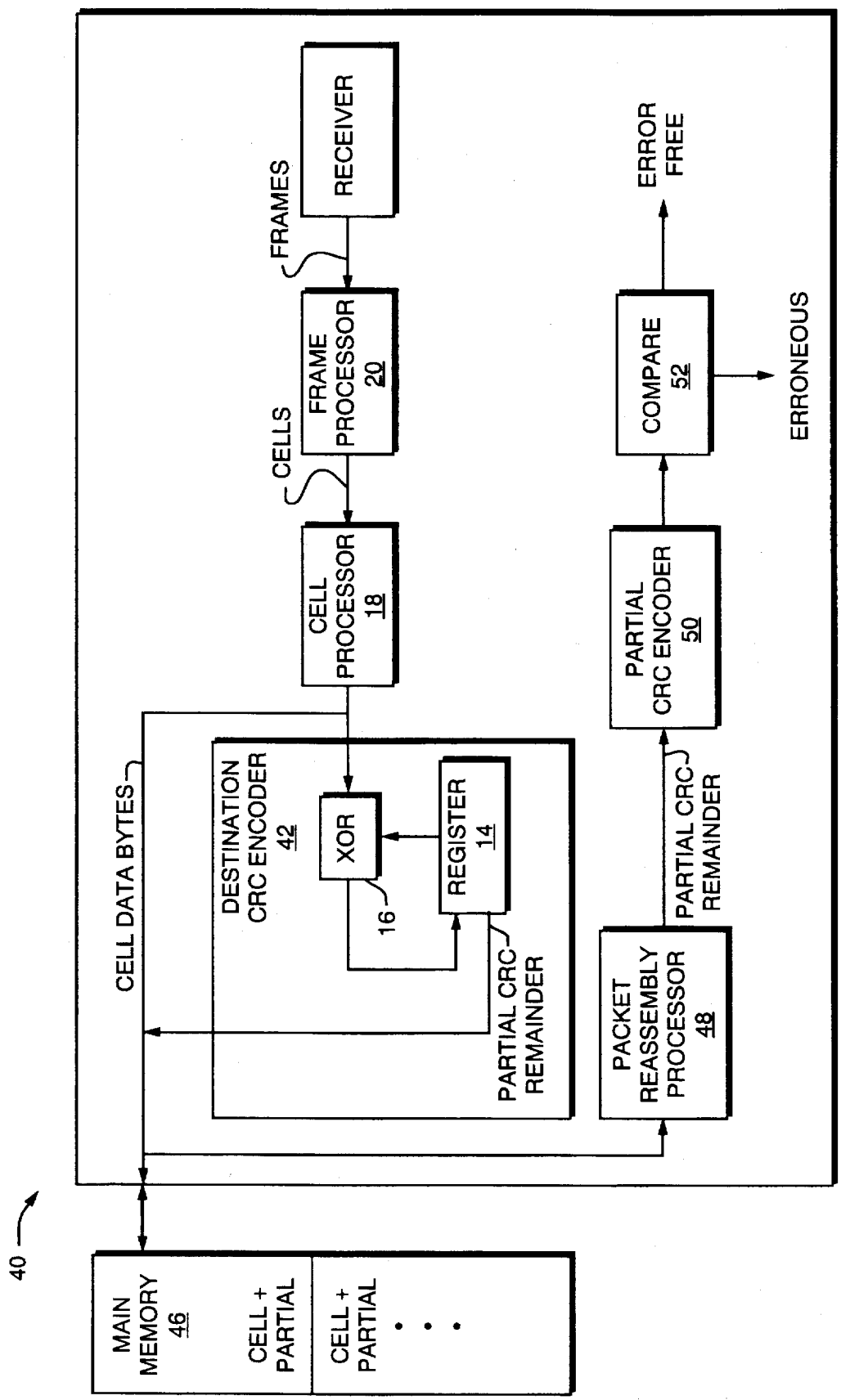
FIG. 3 is a functional block diagram of a destination station that is constructed in accordance with the invention.

Referring now to FIG. 3, a destination station 40 receives the frames 36 (FIG. 2) from the network (not shown) and supplies them to a frame processor 20. The frame processor 20, in turn, supplies the cells that are included in the frame to the cell processor 18, and the cell processor 18 supplies the data bytes included therein to a destination CRC encoder 42.

The destination CRC encoder 42 encodes each cell separately to form, for each, a 32-bit partial CRC remainder. The encoder 42, which operates in essentially the same manner as the source CRC encoder 12, encodes each received cell as if the cell contained the first 48 data bytes of the associated data packet. It thus (i) combines the first data byte of the received cell with the contents of an initialized register 14; (ii) updates the register 14 with the result of the encoding; (iii) encodes a next data byte by combining it with the updated contents of the register 14; (iv) updates the register 14 with the result of the encoding; and (v) repeats iii and iv for each of the remaining data bytes in the cell. After the last data byte in the cell is encoded, the contents of the register 14 are appended to the cell as the partial CRC remainder.

The station 40 provides the cell and the appended partial CRC remainder to an associated memory 46. The memory 46 stores the cell as part of a linked list, which associates the cell with the preceding cells of the same packet. Each received cell, as it is received, is thus fully encoded, and need not be again encoded during packet reassembly operations.

The encoder 42 re-initializes the register 14, and encodes a next received cell to produce a next partial CRC remainder, and so forth. Each cell and its appended partial CRC remainder are stored in the memory 46, as discussed above, and linked to the previous cells in the associated packet. The encoder can thus individually encode the cells of thousands of packets as the cells are received, without having to retrieve data from the memory 46 or maintain thousands of running CRC accumulations, as is required in known prior systems.

When the last cell of a data packet and its partial CRC remainder are stored in the memory, a reassembly processor 48 in the destination station 40 verifies the packet CRC by retrieving, in order from the memory, the appended partial CRC remainders. As the partial CRC remainders are retrieved, the processor sends them to a partial CRC encoder 50. The encoder 50 manipulates, or encodes them, in accordance with update expressions that, as discussed in more detail below, are associated with the CRC code but are not the same expressions that are used by the source station 10 (FIG. 1) to encode the data.

The destination station 40 then compares, in compare circuit 56, the result of the encoding operation to the CRC pattern. If the compare circuit 56 determines that the two match, the destination station treats the reassembled packet as error-free and sends the data in the corresponding cells to an end user. Otherwise, the destination station determines that the packet contains errors and, as appropriate, sends to the source station a request that the station re-transmit the packet. The partial CRC encoder 50 is discussed in more detail with reference to FIG. 4 below.

3. Encoding Using Partial CRC Remainders—In General

In known prior systems, the CRC verification of a received packet is performed by encoding the entire packet to produce a CRC remainder, R(x), in accordance with the following expression:

$$R(x) \equiv (x^i L(x) + x^c F(x)) \bmod G(x) \qquad (1)$$

where i is the length of the packet in bits, L(x) is the seed value that is used to initialize the CRC register, c is the number of bits in the CRC remainder, F(x) is a polynomial of order $x^{i-1}$ with coefficients that are equal to the bits of the packet—modulo 2, and G(x) is the CRC generator polynomial. The terms $x^d$ are displacement values. For example, $x^i$ displaces the seed value, L(x), such that it is combined with the first data byte of the packet.

In cell-based systems, the packet is received as n cells, and $$F(x) = \sum_{k=0}^{n-1} x^{ak} f_k(x) \qquad [2]$$

where a is the length of the data in a cell in bits, $f_k(x)$ is a polynomial of order $x^{a-1}$ with coefficients that are equal to the bits of a cell—modulo 2, and n is the number of cells in the packet. Substituting into formula 1, the CRC remainder for a full packet of n cells is:

$$R(x) = \left( x^{an} L(x) + \sum_{k=0}^{n-1} x^{ak+32} f_k(x) \right) \bmod G(x) \qquad [3]$$

As discussed above with reference to FIG. 3, a partial remainder is determined for each cell by treating the bits of the cell as the bits of the packet. Thus, by definition, the partial CRC remainder, $r_k(x)$, for each cell is:

$$r_k(x) \equiv H(f_k(x)) = x^{32} f_k(x) \bmod G(x) \qquad (4)$$

Note that this is the same as formula 1, with a seed value of L(x)=0.

Substituting into equation 3, $$R(x) = \left( x^{an} L(x) + \sum_{k=0}^{n-1} x^{ak} r_k(x) \right) \bmod G(x). \qquad [5]$$

By defining an expression T(x) as $$T(x) = x^{a-c}$$

where c is again the number of bits in the CRC remainder, and substituting this into equation 4, $$R(x) = \left[ T(x)^n x^{cn} L(x) + \sum_{k=0}^{n-1} T(x)^k x^{ck} r_k(x) \right] \bmod G(x) \qquad [6]$$

and R(x) can be reconstructed from the partial CRC remainders $r_k(x)$ by initializing the CRC register to R(x)=L(x) and determining for k=1 to n−1:

$$R(x) = H(T(x)R(x))^* r_k(x)$$

where "*" again represents XOR'ing.

Since T(x) is a constant, the expression H(T(x)R(x)) reduces, in a station performing the calculations using the CRC of AAL5, to a set of equations set forth in Table 2 below, and discussed below in Section 4.

The same result can be obtained by multiplying the partial results with the associated displacements by defining U(x) $\equiv x^a \bmod G(x)$ and setting W(x)=L(x). Then, for k=n−1 to 1:

$$W(x) = U(x) W(x)^* r_k(x), \text{ and}$$

as a final computation $$R(x) = H(T(x)W(x)) * r_o(x).$$

4. Encoding Using Partial CRC Remainders—In AAL5

Referring again to FIG. 2, a source station 10 in a conventional manner encodes the data bytes of a data packet in accordance with the polynomial $$x^{32} + x^{26} + x^{23} + x^{22} + x^{16} + x^{12} + x^{11} + x^{10} + x^8 + x^7 + x^5 + x^4 + x^2 + x^1 + 1$$

to produce a 32-bit packet CRC remainder. To start the encoding, the register 14, which is a 32-bit register, is initialized to all ones, or in hexadecimal notation to a value of FFFFFFFF. The contents of the register 14 are hereinafter denoted R[31:0], with the numerals in brackets representing the individual bits.

The encoder 12 encodes the first data byte $D_1[7:0]$ by combining it with, that is, XOR'ing it to, R[31:23], to produce a checksum byte B[7:0]. It then combines this checksum byte with the contents of the register to produce an update checksum U[31:0] in accordance with the following table, in which "*" represents XOR'ing:

TABLE 1

U[31] = B[5] * R[23]
U[30] = B[7] * B[4] * R[22]
U[29] = B[7] * B[6] * B[3] * R[21]
U[28] = B[6] * B[5] * B[2] * R[20]
U[27] = B[7] * B[5] * B[4] * B[1] * R[19]
U[26] = B[6] * B[4] * B[3] * B[0] * R[18]
U[25] = B[3] * B[2] * R[17]
U[24] = B[7] * B[2] * B[1] * R[16]
U[23] = B[6] * B[1] * B[0] * R[15]
U[22] = B[0] * R[14]
U[21] = B[5] * R[13]
U[20] = B[4] * R[12]
U[19] = B[7] * B[3] * R[11]
U[18] = B[7] * B[6] * B[2] * R[10]
U[17] = B[6] * B[5] * B[1] * R[9]
U[16] = B[5] * B[4] * B[0] * R[8]
U[15] = B[7] * B[5] * B[4] * B[3] * R[17]
U[14] = B[7] * B[6] * B[4] * B[3] * B[2] * R[6]
U[13] = B[7] * B[6] * B[5] * B[3] * B[2] * B[1] * R[5]
U[12] = B[6] * B[5] * B[4] * B[2] * B[1] * B[0] * R[4]
U[11] = B[4] * B[3] * B[1] * B[0] * R[3]
U[10] = B[5] * B[3] * B[2] * B[0] * R[2]
U[ 9] = B[5] * B[4] * B[2] * B[1] * R[1]
U[ 8] = B[4] * B[3] * B[1] * B[0] * R[0]
U[ 7] = B[7] * B[5] * B[3] * B[2] * B[0]
U[ 6] = B[7] * B[6] * B[5] * B[4] * B[2] * B[1]
U[ 5] = B[7] * B[6] * B[5] * B[4] * B[3] * B[1] * B[0]
U[ 4] = B[6] * B[4] * B[3] * B[2] * B[0]
U[ 3] = B[7] * B[3] * B[2] * B[1]
U[ 2] = B[7] * B[6] * B[2] * B[1] * B[0]
U[ 1] = B[7] * B[6] * B[1] * B[0]
U[ 0] = B[6] * B[0]

The update checksum U[31:0] is then used to update the register 14 to R[31:0]=U[31:0] before the second data byte is encoded.

The encoder next combines the second data byte $D_2[7:0]$ with R[31:24] to produce an associated checksum byte B[7:0] and this byte is combined with the contents of the register 14 in accordance with Table 1 above. The register 14 is again updated with the update checksum U[31:0] produced by this encoding, and a next data byte $D_i$ is encoded in the same manner until all the data bytes in the packet have been encoded and a last update checksum $U_L$[31:0] has been produced. This last checksum is supplied to the cell processor 18 as the packet CRC remainder.

The cell processor 18 groups the data into 48-byte segments and appends to each segment a 5-byte header, to form a plurality of cells. These cells are then transmitted to the destination station.

In the implementation of the destination station discussed below with reference to FIGS. 3 and 4, a seed value, L(x)=FFFFFFFF, is used to initialize the register 14 each time a cell is encoded to form a partial CRC remainder. Using this implementation, each cell is thus encoded as if it is the first cell of a packet. When the partial remainders are later iteratively combined to form the packet CRC remainder, the intermediate results are complemented to compensate for the inclusion of the seed value in second, third, . . . nth cells of the packet.

Figure 4:
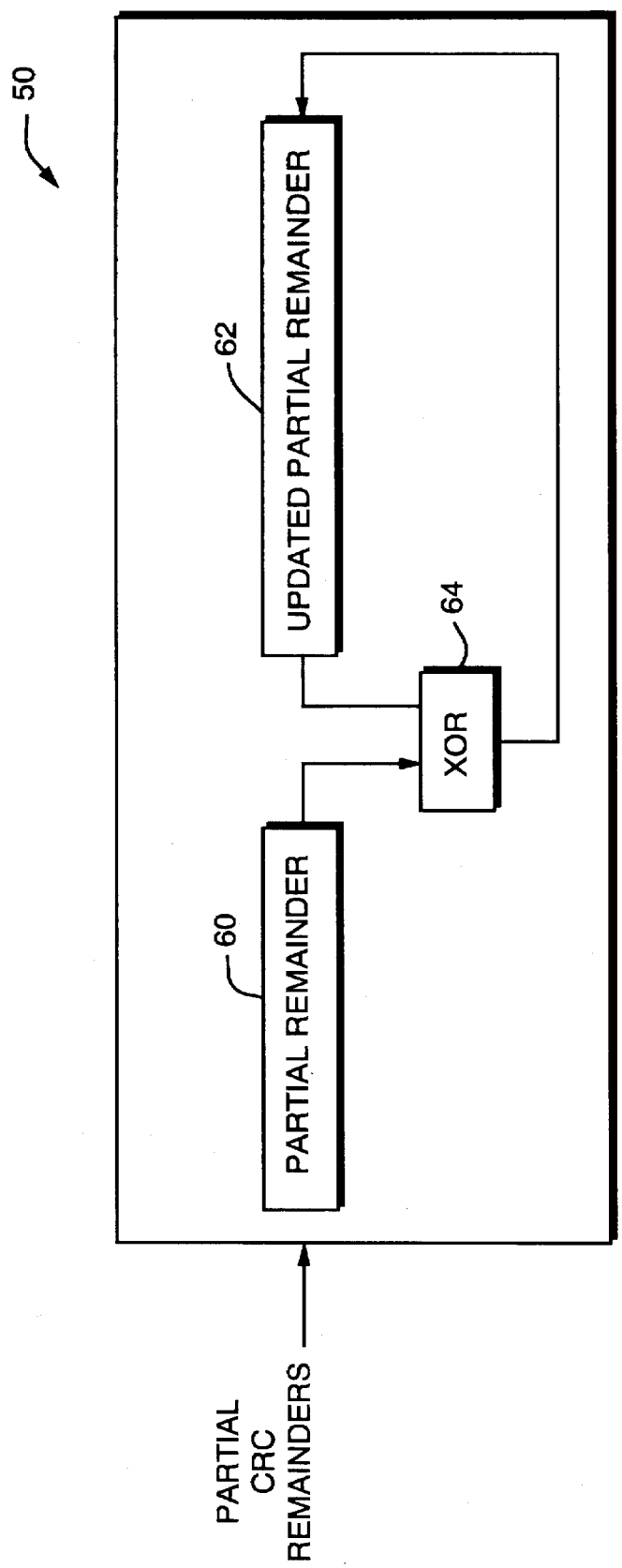
FIG. 4 is a functional block diagram of an encoder that is included in the destination station of FIG. 2.

Referring now to FIGS. 3 and 4, the destination station receives the cells, each of which contain a portion of the data bytes associated with a particular data pocket. The station applies the cells to the destination CRC encoder 42 and encodes each cell individually by initializing the register 14, combining the first data byte of a cell, $D_1$, [7:0] with the contents of the register R[31:24] to produce a checksum byte $B_1$, [7:0] and combining the checksum byte with the contents of the register R[31:0] in accordance with Table 1 above. The encoder 42 uses the results of the encoding to update the register 14 and similarly encodes the remaining 47 bytes of the cell payload. The contents of the register 14 are then appended to the cell as a 32-bit partial CRC remainder, PR[31:0], and the station stores the cell and appended remainder in the memory 46.

When all the cells associated with a particular packet are encoded, the station retrieves from the memory 46 the appended partial CRC remainders $PR_i$[31:0] and provides them to the partial CRC encoder 50. The encoder 50 takes the complement of the first partial CRC remainder $PR_1$ [31:0], to ensure that the contribution of the seed value is not removed from this cell by the complementing of the results of the encoding, and uses the result as the initial contents of an updated partial remainder register 62. It uses the second partial CRC remainder $PR_2$[31:0] as the initial contents of the partial remainder register 60, and it then combines the contents of the two registers 60 and 62 in XOR gates 64 in accordance with the expressions in Table 2 below:

TABLE 2

| | |
|---|---|
| NP[31] = | PR[31]*UP[28]*UP[25]*UP[23]*UP[21]*UP[19]*UP[16] *UP[15]*UP[13]*UP[10]*UP[9]*UP[6]*UP[5]*UP[4]*UP[0]; |
| NP[30] = | PR[30]*UP[27]*UP[24]*UP[22]*UP[20]*UP[18] *UP[15]*UP[14]*UP[12]*UP[9]*UP[8]*UP[5]*UP[4] *UP[3]; |
| NP[29] = | PR[29]*UP[31]*UP[26]*UP[23]*UP[21]*UP[19] *UP[17]*UP[14]*UP[13]*UP[11]*UP[8]*UP[7]*UP[4] *UP[3]*UP[2]; |
| NP[28] = | PR[28]*UP[31]*UP[30]*UP[25]*UP[22]*UP[20] *UP[18]*UP[16]*UP[13]*UP[12]*UP[10]*UP[7]*UP[6] *UP[3]*UP[2]*UP[1]; |
| NP[27] = | PR[27]*UP[31]*UP[30]*UP[29]*UP[24]*UP[21] *UP[19]*UP[17]*UP[15]*UP[12]*UP[11]*UP[9]*UP[6] *UP[5]*UP[2]*UP[1]*UP[0]; |
| NP[26] = | PR[26]*UP[30]*UP[29]*UP[28]*UP[23]*UP[20] *UP[18]*UP[16]*UP[14]*UP[11]*UP[10]*UP[8]*UP[5] *UP[4]*UP[1]*UP[0]; |

TABLE 2-continued

| | |
|---|---|
| NP[25] = | PR[25]*UP[31]*UP[29]*UP[27]*UP[25]*UP[23] *UP[22]*UP[21]*UP[17]*UP[16]*UP[7]*UP[6]*UP[5] *UP[3]; |
| NP[24] = | PR[24]*UP[31]*UP[30]*UP[28]*UP[26]*UP[24] *UP[22]*UP[21]*UP[20]*UP[16]*UP[15]*UP[6]*UP[5] *UP[4]*UP[2]; |
| NP[23] = | PR[23]*UP[30]*UP[29]*UP[27]*UP[25]*UP[23] *UP[21]*UP[20]*UP[19]*UP[15]*UP[14]*UP[5]*UP[4] *UP[3]*UP[1]; |
| NP[22] = | PR[22]*UP[29]*UP[26]*UP[25]*UP[24]*UP[23] *UP[22]*UP[21]*UP[20]*UP[18]*UP[16]*UP[15]*UP[14] *UP[10]*UP[9]*UP[6]*UP[5]*UP[3]*UP[2]; |
| NP[21] = | PR[21]*UP[31]*UP[24]*UP[22]*UP[20]*UP[17] *UP[16]*UP[14]*UP[10]*UP[8]*UP[6]*UP[2]*UP[1] *UP[0]; |
| NP[20] = | PR[20]*UP[31]*UP[30]*UP[23]*UP[21]*UP[19] *UP[16]*UP[15]*UP[13]*UP[9]*UP[7]*UP[5]*UP[1] *UP[0]; |
| NP[19] = | PR[19]*UP[30]*UP[29]*UP[22]*UP[20]*UP[18] *UP[15]*UP[14]*UP[12]*UP[8]*UP[6]*UP[4]*UP[0]; |
| NP[18] = | PR[18]*UP[31]*UP[29]*UP[28]*UP[21]*UP[19] *UP[17]*UP[14]*UP[13]*UP[11]*UP[7]*UP[5]*UP[3]; |
| NP[17] = | PR[17]*UP[31]*UP[30]*UP[28]*UP[27]*UP[20] *UP[18]*UP[16]*UP[13]*UP[12]*UP[10]*UP[6]*UP[4] *UP[2]; |
| NP[16] = | PR[16]*UP[31]*UP[30]*UP[29]*UP[27]*UP[26] *UP[19]*UP[17]*UP[15]*UP[12]*UP[11]*UP[9]*UP[5] *UP[3]*UP[1]; |
| NP[15] = | PR[15]*UP[31]*UP[30]*UP[29]*UP[26]*UP[23] *UP[21]*UP[19]*UP[18]*UP[15]*UP[14]*UP[13]*UP[11] *UP[9]*UP[8]*UP[6]*UP[5]*UP[2]; |
| NP[14] = | PR[14]*UP[30]*UP[29]*UP[28]*UP[25]*UP[22] *UP[20]*UP[18]*UP[17]*UP[14]*UP[13]*UP[12]*UP[10] *UP[8]*UP[7]*UP[5]*UP[4]*UP[1]; |
| NP[13] = | PR[13]*UP[29]*UP[28]*UP[27]*UP[24]*UP[21] *UP[19]*UP[17]*UP[16]*UP[13]*UP[12]*UP[11]*UP[9] *UP[7]*UP[6]*UP[4]*UP[3]*UP[0]; |
| NP[12] = | PR[12]*UP[28]*UP[27]*UP[26]*UP[23]*UP[20] *UP[18]*UP[16]*UP[15]*UP[12]*UP[11]*UP[10]*UP[8] *UP[6]*UP[5]*UP[3]*UP[2]; |
| NP[11] = | PR[11]*UP[31]*UP[28]*UP[27]*UP[26]*UP[23] *UP[22]*UP[21]*UP[17]*UP[16]*UP[14]*UP[13]*UP[11] *UP[7]*UP[6]*UP[2]*UP[1]*UP[0]; |
| NP[10] = | PR[10]*UP[31]*UP[30]*UP[28]*UP[27]*UP[26]*UP[23] *UP[22]*UP[20]*UP[19]*UP[12]*UP[9]*UP[4]*UP[1]; |
| NP[9] = | PR[9]*UP[30]*UP[29]*UP[28]*UP[27]*UP[26]*UP[23] *UP[22]*UP[18]*UP[16]*UP[15]*UP[13]*UP[11]*UP[10] *UP[9]*UP[8]*UP[6]*UP[5]*UP[4]*UP[3]; |
| NP[8] = | PR[8]*UP[31]*UP[29]*UP[28]*UP[27]*UP[26]*UP[25] *UP[22]*UP[21]*UP[17]*UP[15]*UP[14]*UP[12]*UP[10] *UP[9]*UP[8]*UP[7]*UP[5]*UP[4]*UP[3]*UP[2]; |
| NP[7] = | PR[7]*UP[31]*UP[30]*UP[27]*UP[26]*UP[24]*UP[23] *UP[20]*UP[19]*UP[15]*UP[14]*UP[11]*UP[10]*UP[8] *UP[7]*UP[5]*UP[3]*UP[2]*UP[1]*UP[0];. |
| NP[6] = | PR[6]*UP[30]*UP[29]*UP[28]*UP[26]*UP[22]*UP[21] *UP[18]*UP[16]*UP[15]*UP[14]*UP[7]*UP[5]*UP[2] *UP[1]; |
| NP[5] = | PR[5]*UP[31]*UP[29]*UP[28]*UP[27]*UP[25]*UP[21] *UP[20]*UP[17]*UP[15]*UP[14]*UP[13]*UP[6]*UP[4] *UP[1]*UP[0]; |
| NP[4] = | PR[4]*UP[31]*UP[30]*UP[27]*UP[26]*UP[25]*UP[24] *UP[23]*UP[21]*UP[20]*UP[15]*UP[14]*UP[12]*UP[10] *UP[9]*UP[6]*UP[4]*UP[3]; |
| NP[3] = | PR[3]*UP[31]*UP[30]*UP[29]*UP[28]*UP[26]*UP[24] *UP[22]*UP[21]*UP[20]*UP[16]*UP[15]*UP[14]*UP[11] *UP[10]*UP[81]*UP[6]*UP[4]*UP[3]*UP[2]*UP[0]; |
| NP[2] = | PR[2]*UP[31]*UP[30]*UP[29]*UP[28]*UP[27]*UP[25] *UP[23]*UP[21]*UP[20]*UP[19]*UP[15]*UP[14]*UP[13] *UP[10]*UP[9]*UP[7]*UP[5]*UP[3]*UP[2]*UP[1]; |
| NP[1] = | PR[1]*UP[30]*UP[29]*UP[27]*UP[26]*UP[25]*UP[24] *UP[23]*UP[22]*UP[21]*UP[20]*UP[18]*UP[16]*UP[15] *UP[14]*UP[12]*UP[10]*UP[8]*UP[5]*UP[2]*UP[1]; |
| NP[0] = | PR[0]*UP[29]*UP[26]*UP[24]*UP[22]*UP[20]*UP[17] *UP[16]*UP[14]*UP[11]*UP[10]*UP[7]*UP[6]*UP[5] *UP[1]. |
| UP[31:0]= | (NP[31:0])* | where UP[ ] denotes the contents of the updated partial remainder register 62, PR[ ] denotes the contents of the partial remainder register 60, "*" denotes XOR'ing, and ()* denotes taking the complement.

The result of the encoding, UP[31:0], is used to update the updated partial remainder register 62. The encoder uses the next partial remainder, $PR_i[31:0]$, as the new contents of the partial remainder register 60, and again combines the contents of the two registers in XOR gates 64. The result of the encoding, $UP_i[31:0]$, is again used to update the register 62. The encoder continues to encode the retrieved partial CRC remainders and update the register 62, until it encodes the last partial CRC remainder, $PR_L[31:0]$. The result $UP_L[31:0]$, is the CRC remainder associated with the received packet. If the packet is error-free, this remainder is the same as a predetermined CRC pattern.

A numerical example involving a 221-byte data packet is attached as Appendix A.

The exemplary embodiment is described in terms of AAL5 protocol in which cells arrive at a destination station in order. With known prior encoding systems, the in-order delivery is essential to the CRC remainder calculations, since they accumulate the CRC remainder over the entire data packet. In the current system, which encodes each cell individually, the order of arrival of the cells is not critical, as long as the cells can be reassembled in the proper order, such reassembly ensures that the partial CRC remainders will also be in order. Thus the current system can, without modification, be used in connectionless networks.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

APPENDIX A

| Cell Payload | | | | Cell # | CRC Remainder Accumulation Prior Art | Partial CRC Remainders |
|---|---|---|---|---|---|---|
| C6 | 7E | 81 | 6B | | | |
| 4B | FB | E2 | FB | | | |
| 54 | F6 | BD | DF | | | |
| 7C | 1C | E1 | 87 | | | |
| 01 | BF | 31 | DE | | | |
| 56 | 72 | 0F | 47 | | | |
| 67 | 66 | 87 | 59 | | | |
| AA | 88 | 3C | 59 | | | |
| EA | 56 | 13 | 7B | | | |
| D2 | 85 | A1 | D8 | | | |
| 3C | 54 | 55 | 2F | | | |
| 37 | AE | 65 | 5B | | | |
| | | | | 1 | 49BA2E65 | 49BA2E65 |
| DA | 02 | 79 | 98 | | | |
| CC | E3 | 1A | 76 | | | |
| 8E | 5F | D9 | 99 | | | |
| 8F | 1F | 3F | 36 | | | |
| EE | 43 | 78 | 4D | | | |
| 0D | FA | BE | A6 | | | |
| DA | E4 | 86 | 8E | | | |
| DC | 29 | 6D | 4E | | | |
| FF | 56 | E1 | 70 | | | |
| 20 | FB | 8F | B1 | | | |
| 58 | 05 | 90 | C5 | | | |
| 09 | DC | 53 | CD | | | |
| | | | | 2 | 17D6C334 | AC07263B |
| AA | 3B | 48 | 99 | | | |
| 52 | D3 | 52 | 9D | | | |
| 06 | 9F | EA | B5 | | | |
| C2 | 06 | 13 | 98 | | | |

APPENDIX A-continued

| Cell Payload | | | | Cell # | CRC Remainder Accumulation Prior Art | Partial CRC Remainders |
|---|---|---|---|---|---|---|
| 49 | B2 | 01 | 1E | | | |
| AC | 32 | 88 | 31 | | | |
| 9C | 52 | 46 | 95 | | | |
| 71 | 36 | 8F | 57 | | | |
| F6 | 39 | 1D | 16 | | | |
| FA | 88 | 74 | F5 | | | |
| 98 | 7C | 17 | 5C | | | |
| 41 | BB | 6D | 71 | | | |
| | | | | 3 | 0ECCFF4C | EB55AD49 |
| 8E | 0F | 70 | 59 | | | |
| C7 | 01 | 1B | 2F | | | |
| 33 | 3D | 91 | C0 | | | |
| 1D | A5 | 0D | 0D | | | |
| AB | 33 | 8D | 7E | | | |
| 5E | 8F | 3E | E6 | | | |
| 68 | 74 | A6 | 3A | | | |
| B1 | C3 | 93 | 11 | | | |
| A8 | 64 | C7 | DB | | | |
| CA | E0 | 60 | E1 | | | |
| F3 | BF | 09 | 00 | | | |
| 67 | A2 | E3 | 25 | 4 | 9A089FD2 | B5A47FF6 |
| A0 | 21 | 31 | 87 | | | |
| D5 | 62 | C5 | A8 | | | |
| 4F | 7E | 2E | 09 | | | |
| 6B | 94 | 9F | B0 | | | |
| 6D | A9 | 9E | 5A | | | |
| 0B | 46 | 70 | 80 | | | |
| B6 | CF | 47 | 0C | | | |
| A6 | 00 | 00 | 00 | <— end of packet (A6) plus pad | | |
| 00 | 00 | 00 | 00 | <— pad | | |
| 00 | 00 | 00 | 00 | <— more pad | | |
| 00 | 00 | 00 | DD | <— length | | |
| 17 | 7F | 07 | A6 | <— checksum inserted when the packet was segmented | | |
| | | | | 5 | C704DD7B | 82589858 |

After the encoding of the 5 partial remainders, the result is C704DD7B, which is the CRC pattern.

What is claimed is:

1. A system for determining if a data packet received in the form of cells contains errors, the system including:
   A. a first encoder for encoding the data included in a received cell in accordance with a cyclic redundancy check code to produce an associated partial remainder;
   B. means for appending the partial remainder to the received cell;
   C. storage means for storing the cell and the appended partial remainder, the storage means linking the cell by pointers to previously stored cells associated with the same data packet;
   D. means for determining if a cell is the last cell of a packet;
   E. means for retrieving the stored partial remainders associated with the cells of a selected data packet once the last cell of the selected packet has been encoded by the first encoder; and
   F. a second encoder for manipulating the partial remainders associated with the cells to produce a packet remainder;
   G. comparison means for comparing the packet remainder with a predetermined pattern, the comparison means determining that the data packet is error-free if the remainder and the pattern match.

2. The system of claim 1 further including means for retrieving the stored cells, said means retrieving the cells if the comparison means determines that the data within the cells is error-free.

3. The system of claim 1, wherein the first encoder encodes the cells by initializing the encoder for each cell to an initial value that is associated with an initial encoding of the first byte of the data packet at a source station.

4. The system of claim 3, wherein the second encoder manipulates the partial CRC remainders in accordance with Table 2, in which UP[ ] denotes an updated CRC partial remainder, PR[ ] denotes a partial remainder associated with a cell, and "*" denotes XOR'ing.

5. A communication system including:

A. a source station for transmitting data, the source station including:
  i. a source station encoder for encoding a data packet and segmenting the data packet into fixed-sized cells, the encoder appending the result of the encoding to the packet before segmenting the packet,
  ii. means for transmitting the cells; and B. a destination station for receiving transmitted cells, the destination station including:
  i. a first encoder for encoding the data included in a received cell in accordance with a cyclic redundancy check code to produce an associated partial remainder;
  ii. means for appending the partial remainder to the received cell;
  iii. storage means for storing the cell and the appended partial remainder, the storage means linking the cell by pointers to previously stored cells associated with the same data packet;
  iv. means for determining if a cell is the last cell of a packet;
  v. means for retrieving the stored partial remainders associated with the cells belonging to a selected data packet once the last cell of the selected packet has been encoded by the first encoder;
  vi. a second encoder for manipulating the partial remainders associated with the retrieved cells to produce a packet remainder; and
  vii. comparison means for comparing the packet remainder with a predetermined pattern, the comparison means determining that the data packet is error-free if the remainder and the pattern match.

6. The system of claim 5, wherein the first encoder encodes the cells by initializing the encoder for each cell to an initial value that is associated with an initial encoding of the first byte of the data packet at the source station.

7. The system of claim 6, wherein the second encoder manipulates the partial CRC remainders in accordance with Table 2, in which UP[ ] denotes an updated CRC partial remainder, PR[ ] denotes a partial remainder associated with a cell, and "*" denotes XOR'ing.

8. A system for determining if a data packet received in the form of cells contains errors, the system including:

A. a first encoder for encoding the data included in a received cell in accordance with a cyclic redundancy check code to produce an associated partial remainder;

B. storage means for storing the cell and the partial remainder, the storage means linking the cell and the partial remainder by pointers to previously stored cells and partial remainders associated with the same data packet;

D. means for determining if a cell is the last cell of a packet;

E. means for retrieving the stored partial remainders associated with the cells of a selected data packet once the last cell of the selected packet has been encoded by the first encoder; and F. a second encoder for manipulating the partial remainders associated with the cells to produce a packet remainder;

G. comparison means for comparing the packet remainder with a predetermined pattern, the comparison means determining that the data packet is error-free if the remainder and the pattern match.

9. The system of claim 8 further including means for retrieving the stored cells, said means retrieving the cells if the comparison means determines that the data within the cells are error-free.

10. The system of claim 8, wherein the first encoder encodes the cells by initializing the encoder for each cell to an initial value that is associated with an initial encoding of the first byte of the data packet at a source station.

11. The system of claim 10, wherein the second encoder manipulates the partial CRC remainders in accordance with Table 2, in which UP[ ] denotes an updated CRC partial remainder, PR[ ] denotes a partial remainder associated with a cell, and "*" denotes XOR'ing.

* * * * *